(12) United States Patent
Mu et al.

(10) Patent No.: US 12,319,152 B2
(45) Date of Patent: Jun. 3, 2025

(54) SWITCHABLE BATTERY DISCONNECT UNIT FOR ELECTRIFIED VEHICLES USING PROTECTION DEVICES INCLUDING CONTRACTORS AND INTEGRATED CIRCUIT BREAKS

(71) Applicant: FCA US LLC, Auburn Hills, MI (US)

(72) Inventors: William Mu, Troy, MI (US); Timothy Mrosewske, Berkley, MI (US); Karina K Morley, New Hudson, MI (US); Qingyuan Tan, LaSalle (CA)

(73) Assignee: FCA US LLC, Auburn Hills, MI (US)

( * ) Notice: Subject to any disclaimer, the term of this patent is extended or adjusted under 35 U.S.C. 154(b) by 55 days.

(21) Appl. No.: 18/498,444

(22) Filed: Oct. 31, 2023

(65) Prior Publication Data

US 2025/0135894 A1 May 1, 2025

(51) Int. Cl.
*B60L 3/00* (2019.01)
*B60L 3/04* (2006.01)
*H02H 5/04* (2006.01)

(52) U.S. Cl.
CPC .............. *B60L 3/0046* (2013.01); *B60L 3/04* (2013.01); *H02H 5/04* (2013.01)

(58) Field of Classification Search
CPC ............ B60L 3/0046; B60L 3/04; H02H 5/04
See application file for complete search history.

(56) References Cited

U.S. PATENT DOCUMENTS

| 10,854,933 | B2 | 12/2020 | Hao et al. |
| 11,754,629 | B2 | 9/2023 | Fan et al. |
| 2018/0366704 | A1* | 12/2018 | Menig ................ H01M 50/204 |
| 2021/0078442 | A1 | 3/2021 | Prasad et al. |
| 2024/0157814 | A1* | 5/2024 | Hundt .................... H02J 7/143 |

FOREIGN PATENT DOCUMENTS

| CN | 116461336 A | 7/2023 |
| WO | 2021089281 A1 | 5/2021 |

OTHER PUBLICATIONS

Conlon, Brendan et al., "Switchable 400V-800V High Voltage Architecture for Ultium Battery Electric Trucks", IEEE Energy Conversion Congress and Exposition (ECCE) 2022.

* cited by examiner

*Primary Examiner* — Jared Fureman
*Assistant Examiner* — Duc M Pham
(74) *Attorney, Agent, or Firm* — Jeremy J. Klobucar

(57) ABSTRACT

A switchable battery disconnect unit (BDU) system for an electrified vehicle includes a switchable BDU for a high voltage battery system of the electrified vehicle, the switchable BDU including one or more protection devices that each include both a contactor and an integrated circuit breaker, and a controller configured to control the switchable BDU to switch between 400 Volts (400V) and 800V direct current (DC) modes for powering an electrified powertrain of the electrified vehicle and for recharging the high voltage battery system and monitor and reset the protection device in response to an actuation of the integrated circuit breaker, wherein the protection device does not include a replaceable thermal fuse.

20 Claims, 3 Drawing Sheets

SWITCHABLE BATTERY DISCONNECT UNIT FOR ELECTRIFIED VEHICLES USING PROTECTION DEVICES INCLUDING CONTRACTORS AND INTEGRATED CIRCUIT BREAKS

FIELD

The present application generally relates to electrified vehicle high voltage architectures and, more particularly, to a switchable high voltage architecture for electrified vehicles using protection devices that include contactors and integrated circuit breakers.

BACKGROUND

Today's electrified vehicles have high voltage architectures for powering one or more electric motors. These high voltage architectures include a high voltage battery system that is selectively connected to a high voltage bus by closing one or more contactors, which allows for selective power on/off control of the high voltage bus for safety reasons. Thermal fuses are often implemented for current spike protection at the high voltage bus. When a thermal fuse is blown, however, it requires replacement, which could be a timely and costly service procedure. In addition, there is a possibility that the contactors could weld closed during high current spikes, regardless of the state of the thermal fuse(s). Contactor welding could further increase service time/costs. Accordingly, while such conventional electrified vehicle high voltage architectures do work well for their intended purpose, there exists an opportunity for improvement in the relevant art.

SUMMARY

According to one example aspect of the invention, a switchable battery disconnect unit (BDU) system for an electrified vehicle is presented. In one exemplary implementation, the switchable BDU system comprises a switchable BDU for a high voltage battery system of the electrified vehicle, the switchable BDU including one or more protection devices that each include both a contactor and an integrated circuit breaker and a controller configured to control the switchable BDU to switch between 400 Volts (400V) and 800 V direct current (DC) modes for powering an electrified powertrain of the electrified vehicle and for recharging the high voltage battery system and monitor and reset the protection device in response to an actuation of the integrated circuit breaker, wherein the protection device does not include a replaceable thermal fuse.

In some implementations, the protection device is configured to actuate or open the integrated circuit breaker in response to a current spike. In some implementations, the actuation or opening of the integrated circuit breaker prevents the current spike from welding the contactor closed. In some implementations, the high voltage battery system is separable into first and second high voltage batteries, and wherein the switchable BDU includes three protection devices and five relays. In some implementations, at least one of the one or more protection devices further includes an integrated temperature sensor.

In some implementations, a first node connects a positive terminal of the first high voltage battery, an input of a first relay, one input of a first protection device, and one input of a third protection device, wherein outputs of the third protection device connect to first and second charging outputs, a second node connects a negative terminal of the first high voltage battery, another input of the first protection device, an input of a third relay, and an input of a fifth relay, a third node connects a positive terminal of the second high voltage battery, an output of the fifth relay, an input of a second relay, and one input of a second protection device, a fourth node connects a negative terminal of the second high voltage battery, another input of the second protection device, and an input of a fourth relay, a fifth node connects an output of the first relay, one output of the first protection device, another input of the third protection device, an output of the second protection device, the fourth node, and a first auxiliary output, and a sixth node connects another output of the first protection device, an output of the third relay, another output of the second protection device, an output of the fourth relay, and a second auxiliary output.

In some implementations, the controller is configured to control the switchable BDU to transition from standby to a drive mode by commanding the following sequence: close the fourth relay, close the second relay, close the contactor of the second protection device, open the second and fourth relays, and close the contactor of the first protection device, wherein both the first and second high voltage batteries are connected to the electrified powertrain via the first and second auxiliary outputs. In some implementations, the controller is configured to control the switchable BDU to transition from standby to a 400 V charging mode by commanding the following sequence: close the fourth relay, close the second relay, close the contactor of the second protection device, open the second and fourth relays, close the contactor of the first protection device, and close the contactor of the third protection device, wherein both the first and second high voltage batteries are thereby connected, through the third protection device in parallel, to a DC fast charging station via the first and second charging outputs, and wherein both the first and second high voltage batteries are also connected to an auxiliary circuit via the first and second auxiliary outputs.

In some implementations, the controller is configured to control the switchable BDU to transition from standby to an 800 V charging mode by commanding the following sequence: close the third relay, close the first relay, open the contactor of the first protection device, open the third and first relays, close the fifth relay, and close the contactor of the third protection device, wherein both the first and second high voltage batteries are connected, through the third protection device in series, to a DC fast charging station via the first and second charging outputs. In some implementations, the controller is further configured to control the switchable BDU to shift the auxiliary load from the first high voltage battery to the second high voltage battery by commanding the following sequence: open the contactor of the first protection device, close the fourth relay, close the second relay, close the contactor of the second protection device, and open the second and fourth relays.

According to another example aspect of the invention, a control method for a switchable BDU system for an electrified vehicle is presented. In one exemplary implementation, the control method comprises providing a switchable BDU for a high voltage battery system of the electrified vehicle, the switchable BDU including one or more protection devices that each include both a contactor and an integrated circuit breaker, controlling, by a controller, the switchable BDU to switch between 400 V and 800 V DC modes for powering an electrified powertrain of the electrified vehicle and for recharging the high voltage battery system, and monitoring and resetting, by the controller, the protection device in response to an actuation of the integrated circuit breaker, wherein the protection device does not include a replaceable thermal fuse.

In some implementations, the protection device is configured to actuate or open the integrated circuit breaker in response to a current spike. In some implementations, the actuation or opening of the integrated circuit breaker prevents the current spike from welding the contactor closed. In some implementations, the high voltage battery system is separable into first and second high voltage batteries, and wherein the switchable BDU includes three protection devices and five relays. In some implementations, at least one of the one or more protection devices further includes an integrated temperature sensor.

In some implementations, a first node connects a positive terminal of the first high voltage battery, an input of a first relay, one input of a first protection device, and one input of a third protection device, wherein outputs of the third protection device connect to first and second charging outputs, a second node connects a negative terminal of the first high voltage battery, another input of the first protection device, an input of a third relay, and an input of a fifth relay, a third node connects a positive terminal of the second high voltage battery, an output of the fifth relay, an input of a second relay, and one input of a second protection device, a fourth node connects a negative terminal of the second high voltage battery, another input of the second protection device, and an input of a fourth relay, a fifth node connects an output of the first relay, one output of the first protection device, another input of the third protection device, an output of the second protection device, the fourth node, and a first auxiliary output, and a sixth node connects another output of the first protection device, an output of the third relay, another output of the second protection device, an output of the fourth relay, and a second auxiliary output.

In some implementations, the control method further comprises controlling, by the controller, the switchable BDU to transition from standby to a drive mode by commanding the following sequence: close the fourth relay, close the second relay, close the contactor of the second protection device, open the second and fourth relays, and close the contactor of the first protection device, wherein both the first and second high voltage batteries are connected to the electrified powertrain via the first and second auxiliary outputs. In some implementations, the method further comprises controlling, by the controller, the switchable BDU to transition from standby to a 400 V charging mode by commanding the following sequence: close the fourth relay, close the second relay, close the contactor of the second protection device, open the second and fourth relays, close the contactor of the first protection device, and close the contactor of the third protection device, wherein both the first and second high voltage batteries are thereby connected, through the third protection device in parallel, to a DC fast charging station via the first and second charging outputs, and wherein both the first and second high voltage batteries are also connected to an auxiliary circuit via the first and second auxiliary outputs.

In some implementations, the method further comprises controlling, by the controller, the switchable BDU to transition from standby to an 800 V charging mode by commanding the following sequence: close the third relay, close the first relay, open the contactor of the first protection device, open the third and first relays, close the fifth relay, and close the contactor of the third protection device, wherein both the first and second high voltage batteries are connected, through the third protection device in series, to a DC fast charging station via the first and second charging outputs. In some implementations, the method further comprises controlling, by the controller, the switchable BDU to shift the auxiliary load from the first high voltage battery to the second high voltage battery by commanding the following sequence: open the contactor of the first protection device, close the fourth relay, close the second relay, close the contactor of the second protection device, and open the second and fourth relays.

Further areas of applicability of the teachings of the present application will become apparent from the detailed description, claims and the drawings provided hereinafter, wherein like reference numerals refer to like features throughout the several views of the drawings. It should be understood that the detailed description, including disclosed embodiments and drawings referenced therein, are merely exemplary in nature intended for purposes of illustration only and are not intended to limit the scope of the present disclosure, its application or uses. Thus, variations that do not depart from the gist of the present application are intended to be within the scope of the present application.

DESCRIPTION

As previously discussed, conventional electrified vehicle high voltage architectures include separate contactors and thermal fuses. Replacing blown thermal fuses and/or welded contactors requires substantial service time/costs. Thus, there exists an opportunity for improvement in the relevant art. One particularly desirable high voltage architecture is a 400V/800 V switchable battery disconnect unit (BDU) circuit that allows for both 400 V boosted 800 V fast charging, which includes multiple contactors and thermal fuses. Accordingly, improved switchable BDU systems and methods that utilize protection devices having contactors and integrated circuit breakers are presented herein. In some implementations, these protection devices could also integrate temperature sensors. Multiple protection devices could be implemented in an existing 400V/800 V switchable BDU architecture in place of existing contactors and thermal fuses to achieve the same functionality without the drawbacks of time consuming and expensive service as described above. In addition to reduced service time/costs, the switchable BDU provides for more charging options and a faster/better customer experience.

Figure 1:
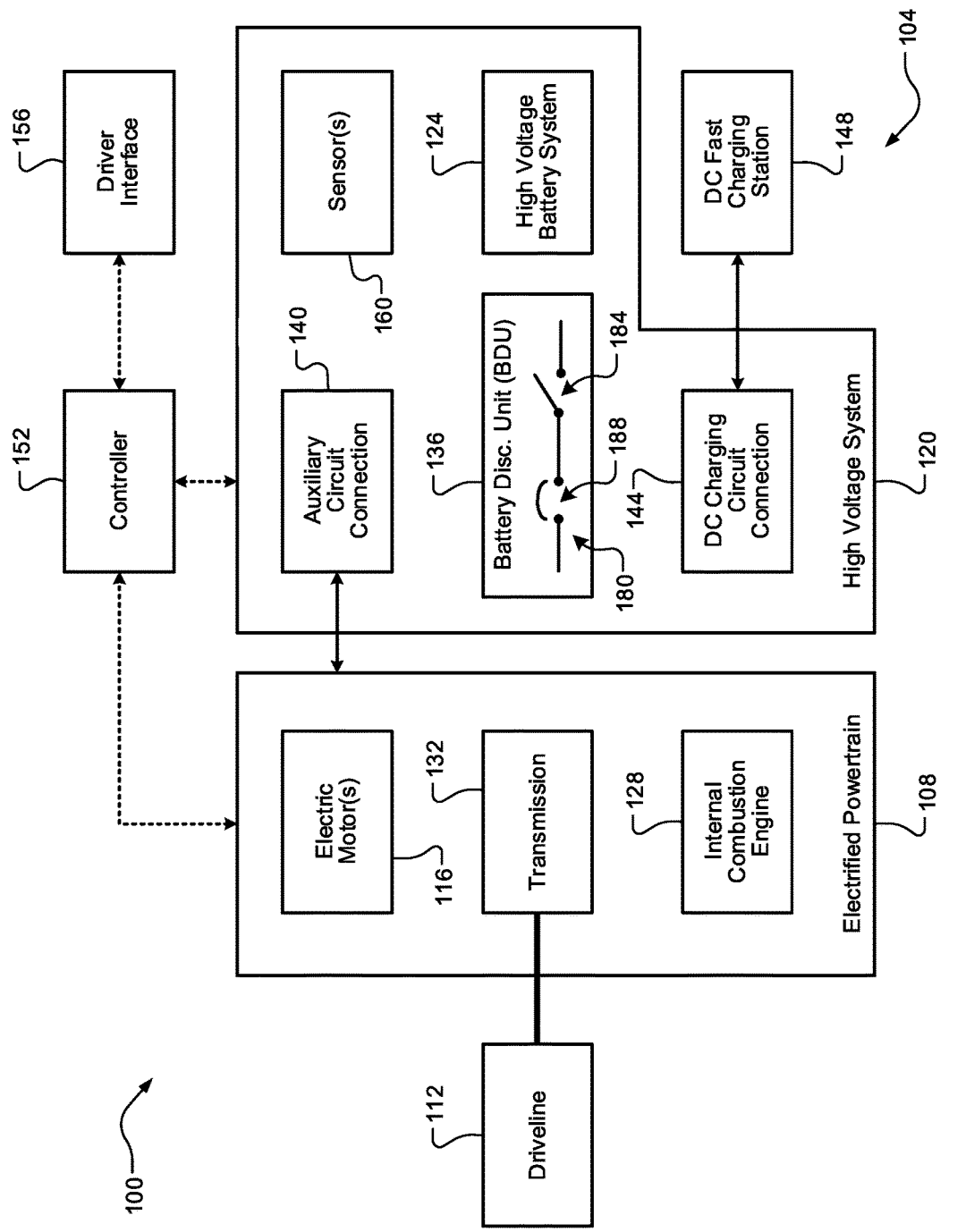
FIG. 1 is a functional block diagram of an electrified vehicle having an example switchable battery disconnect unit (BDU) system according to the principles of the present application.

Referring now to FIG. 1, a functional block diagram of an electrified vehicle 100 having an example switchable BDU system 104 according to the principles of the present application is illustrated. The electrified vehicle 100 (also referred to as "vehicle 100") generally comprises an electrified powertrain 108 configured to generate and transfer drive torque to a driveline 112 for vehicle propulsion. The electrified powertrain 108 includes one or more electric motors 116 that are powered by high voltage power provided by a high voltage system 120 that includes a high voltage battery system 124. In some implementations, the electrified powertrain 108 has a hybrid configuration and also includes an optional internal combustion engine 128 configured to combust a mixture of air and liquid fuel (gasoline, diesel, etc.) to generation mechanical energy (drive torque), which could be converted into electrical energy (e.g., for battery recharging and/or powering auxiliary loads). A transmission 132 (e.g., a multi-speed automatic transmission) transfers the drive torque to the driveline 112.

The high voltage system 120 further comprises a switchable BDU 136 that is configured to connect the high voltage battery system 124 to auxiliary loads (e.g., the electrified powertrain 108) via an auxiliary circuit connection 140 or to a charging system (e.g., a DC fast charging station 148) via a DC charging circuit connection 144. A controller 152 is configured to control operation of the electrified vehicle 100. This includes, for example, controlling the electrified powertrain 108 to generate and transfer an amount of drive torque to satisfy a torque request, which could be provided by a driver of the electrified vehicle 100 via a driver interface 156 (e.g., an accelerator pedal). The controller 152 could also control the switchable BDU 136 as part of the control techniques of the present application. This could include, for example, receiving measurements from one or more sensors 160 (current sensors, voltage sensors, temperature sensors, etc.) associated with the high voltage system 120. It will also be appreciated that the switchable BDU 136 could include its own controller, such as a battery management system (BMS).

The switchable BDU 136 is switchable in that it is configured to enable both 400 V DC fast charging as well as boosted 800 V DC fast charging. The switchable BDU 136 includes one or more protection devices 180 according to some implementations of the present application, which provide for both power connection/transfer (via a contactor 184 or switch/relay) and circuit protection (via an integrated circuit breaker 188, e.g., in series with the contactor). It will be appreciated that the illustrated example configuration 180 is merely one example configuration of the protection device(s) 180 and that they could have other suitable configurations include at least the contactor 184 and an integrated circuit breaker 188. It will also be appreciated, however, that at least some of the above-described sensor functionality (i.e., sensor(s) 160) could be integrated into these protection devices (e.g., current spike sensing to open the circuit breaker, as well as optional temperature sensing). Depending on the specific configuration of the electrified vehicle 100 and, more particularly, the high voltage system 120, the switchable BDU 136 according to the present application could include any suitable number of these protection devices (i.e., one or more protection devices). An example configuration of and a description of the operation of the switchable BDU 136 will now be described in greater detail.

Figure 2:
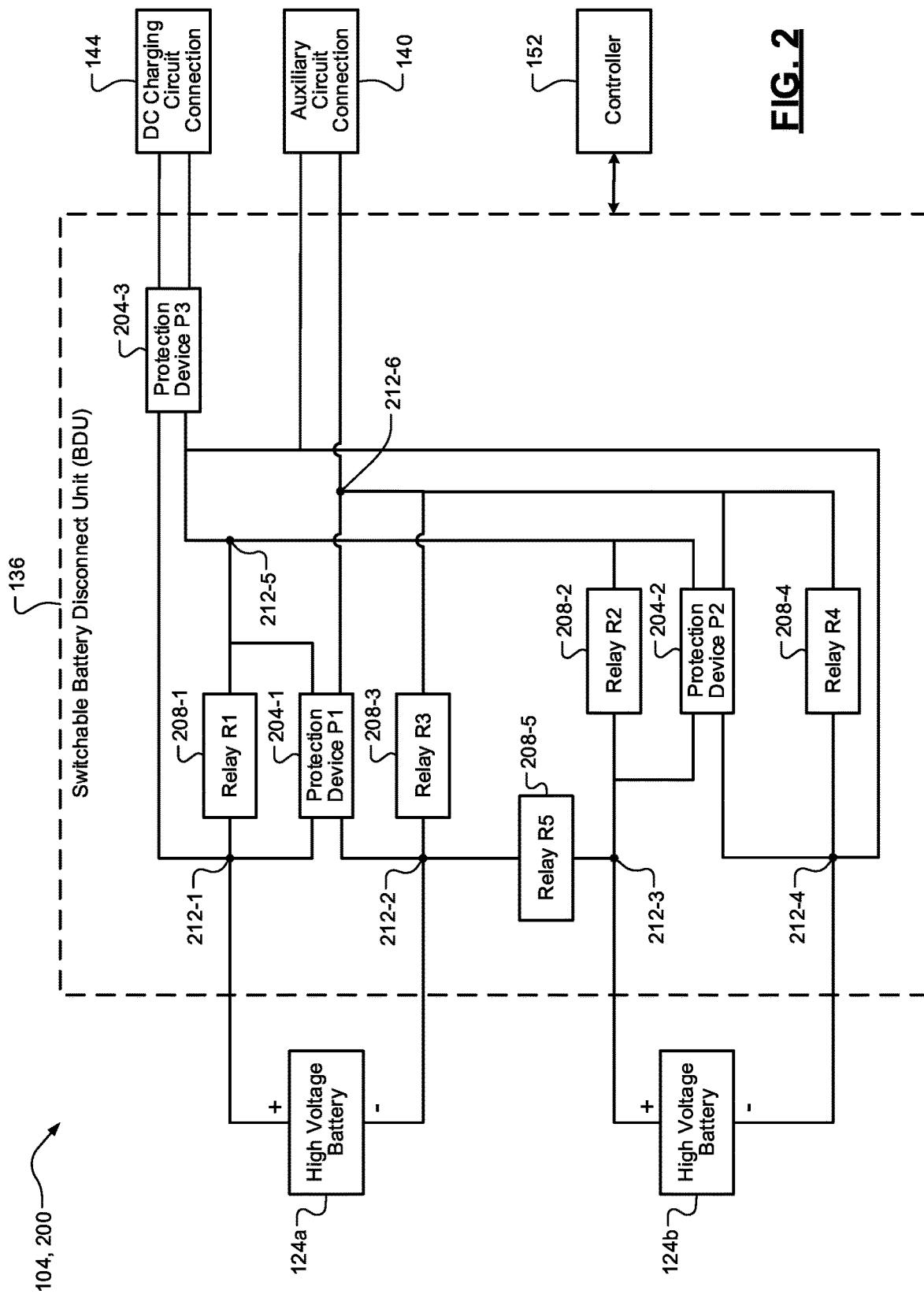
FIG. 2 is a circuit diagram for an example configuration of the switchable BDU system including a plurality of protection devices according to the principles of the present application.

Referring now to FIG. 2, a circuit diagram for an example configuration 200 of the switchable BDU system 104 and the switchable BDU 136 including a plurality of protection devices 204 according to the principles of the present application is illustrated. As previously discussed, the switchable BDU system 104 includes the switchable BDU 136 and the controller 152 or another suitable control system, such as a BMS. As shown, the switchable BDU 136 includes three protection devices 204-1 . . . 204-3 (collectively, "protection devices 204") that are also labeled P1 . . . . P3, respectively. The switchable BDU 136 also includes five contactors, switches, or relays 208-1 . . . 208-5 (collectively, "relays 208") that are also labeled R1 . . . . R5, respectively. The high voltage battery system 124 is dividable into two high voltage batteries 124a, 124b as the high voltage battery system 124 is a combination of a plurality of smaller battery cells connected in series to collectively provide a much higher overall voltage (400 V DC, 800 V DC, etc.). The protection devices 204 and the relays 208 are controllable (e.g., by controller 152) to open/close in desired patterns in order to provide the desired functionality. Nodes 212-1 . . . 212-6 (collectively, "nodes 212") are also labeled to define connections between the various components of the switchable BDU 136. It will be appreciated that these are the primary components of the switchable BDU 136 and that there could be other non-illustrated components, such as one or more fuses.

For example, in a first "standby to drive" mode transition, the following sequence is commanded: R4 closes, R2 closes, P2 closes, R2 and R4 open, and then P1 closes. In doing so, both high voltage batteries 124a and 124b are connected to the auxiliary circuit (e.g., the electrified powertrain 108) via the auxiliary circuit connection 140. Also for example, in a second "standby to 400V charge" mode transition, the following sequence is commanded: R4 closes, R2 closes, P2 closes, R2 and R4 open, P1 closes, and then P3 closes. In doing so, both of the high voltage batteries 124a and 124b are connected, through P3 in parallel, to a charging system (e.g., DC fast charging system 148) via the charging circuit connection 144, and both of the high voltage batteries 124a and 124b are also connected to the auxiliary circuit via the auxiliary circuit connection 140. Also for example, in a third "standby to 800 V charge" mode transition, the following sequences are commanded. First: R3 closes, R1 closes, P1 closes, R3 and R1 open, R5 closes, and P3 closes. Next, to shift the auxiliary load from the first high voltage battery 124a to the second high voltage battery 124b: P1 opens, R4 closes, R2 closes, P2 closes, and then R2 and R4 open. Thus, both of the high voltage batteries 124a and 124b are connected, through P3 in series, to the charging circuit (e.g., the DC fast charging station 148) via the charging circuit connection 144.

Figure 3:
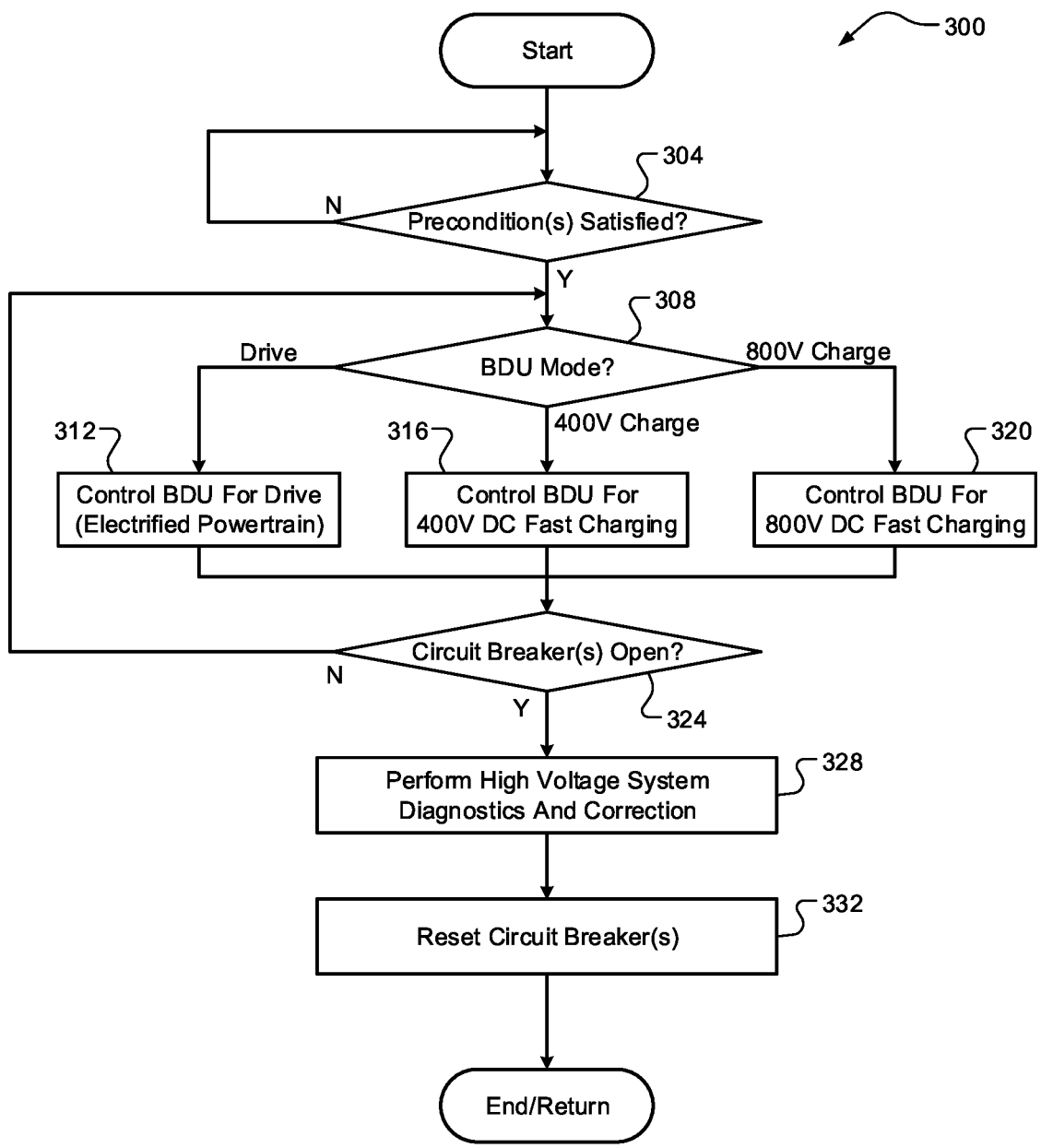
FIG. 3 is a flow diagram of an example switchable BDU control method for an electrified vehicle according to the principles of the present application.

Referring now to FIG. 3, a flow diagram of an example switchable BDU control method 300 for an electrified vehicle according to the principles of the present application is illustrated. While the electrified vehicle 100 and its components (e.g., switchable BDU system 104) are specifically referenced for illustrative/descriptive purposes, it will be appreciated that the method 300 could be applicable to any suitable electrified vehicle high voltage architecture. At 304, the controller 152 optionally determines whether a set of one or more preconditions are satisfied. This could include, for example, the electrified vehicle 100 being powered up and the switchable BDU 136 being in a standby mode and, there being no malfunctions present that would otherwise inhibit the operation of the electrified vehicle 100 and, more particularly, the control of the switchable BDU 136 according to the techniques of the present application. When false, the method 300 ends or returns to 304. When true, the method 300 continues to 308. At 308, the controller 152 determines a desired mode for the switchable BDU 136. This desired mode could be, for example, a transition from the standby mode to one of a drive mode, a 400 V charging mode, and an 800 V charging mode.

When the desired mode is the drive mode, the method 300 proceeds to 312 where the controller 152 controls switchable BDU 136 as previously described herein to connect the high voltage batteries 124a, 124b to the auxiliary output (e.g., the electrified powertrain 108) via the auxiliary circuit connection 140. The method 300 then continues to 324. When the desired mode is the 400 V charging mode, the method 300 proceeds to 316 where the controller 152 controls the switchable BDU 136 as previously described herein to connect both the first and second high voltage batteries 124a, 124b, through the third protection device 204-3 (P3) in parallel, to a charging system (e.g., the DC fast charging station 148) via the charging circuit connection 144. In this mode, the first and second high voltage batteries 124a, 124b could also be connected to the auxiliary output via the auxiliary circuit connection 140. The method 300 then continues to 324. When the desired mode is the 800 V charging mode, the method 300 proceeds to 320 where the controller 152 controls the switchable BDU 136 as previously described herein to connect both the first and second high voltage batteries 124a, 124b, through the third protection device 204-3 (P3) in series, to the charging system (e.g., the DC fast charging station 148) via the charging circuit connection 144.

In this mode, the controller 152 could also control the switchable BDU 136 as previously described herein to shift the auxiliary load from the first high voltage battery 124a to the second high voltage battery 124b. The method 300 then continues to 324. At 324, the controller 152 monitors the protection devices 204 to determine whether any of their integrated circuit breakers have been tripped/actuated or opened. When false, the method 300 ends or returns to 308 and continues operation (e.g., until a mode change for the switchable BDU 136). When true, the method 300 continues to 328. At 328, the controller 152 performs diagnostics and possible remedial action or correction of any malfunctions or faults at the high voltage system 120. This could also include setting one or more diagnostic flags, which could then require further diagnostics by a human service technician. Once the malfunctions/faults that caused the circuit breaker(s) to actuate/open are resolved, the method 300 proceeds to 332 where the controller 152 resets the circuit breaker(s) of the protection devices 204 to a closed position. The method 300 then ends.

It will be appreciated that the term "controller" as used herein refers to any suitable control device or set of multiple control devices that is/are configured to perform at least a portion of the techniques of the present application. Non-limiting examples include an application-specific integrated circuit (ASIC), one or more processors and a non-transitory memory having instructions stored thereon that, when executed by the one or more processors, cause the controller to perform a set of operations corresponding to at least a portion of the techniques of the present application. The one or more processors could be either a single processor or two or more processors operating in a parallel or distributed architecture.

It should also be understood that the mixing and matching of features, elements, methodologies and/or functions between various examples may be expressly contemplated herein so that one skilled in the art would appreciate from the present teachings that features, elements and/or functions of one example may be incorporated into another example as appropriate, unless described otherwise above.

What is claimed is:

1. A switchable battery disconnect unit (BDU) system for an electrified vehicle, the switchable BDU system comprising:
   a switchable BDU for a high voltage battery system of the electrified vehicle, the switchable BDU including one or more protection devices that each include both a contactor and an integrated circuit breaker; and
   a controller configured to:
      control the switchable BDU to switch between 400 Volts (400V) and 800 V direct current (DC) modes for powering an electrified powertrain of the electrified vehicle and for recharging the high voltage battery system; and
      monitor and reset the protection device in response to an actuation of the integrated circuit breaker,
      wherein each protection device does not include a replaceable thermal fuse.

2. The switchable BDU system of claim 1, wherein the protection device is configured to actuate or open the integrated circuit breaker in response to a current spike.

3. The switchable BDU system of claim 2, wherein the actuation or opening of the integrated circuit breaker prevents the current spike from welding the contactor closed.

4. The switchable BDU system of claim 1, wherein the high voltage battery system is separable into first and second high voltage batteries, and wherein the switchable BDU includes three protection devices and five relays.

5. The switchable BDU system of claim 4, wherein:
   a first node connects a positive terminal of the first high voltage battery, an input of a first relay, one input of a first protection device, and one input of a third protection device, wherein outputs of the third protection device connect to first and second charging outputs;
   a second node connects a negative terminal of the first high voltage battery, another input of the first protection device, an input of a third relay, and an input of a fifth relay;
   a third node connects a positive terminal of the second high voltage battery, an output of the fifth relay, an input of a second relay, and one input of a second protection device;
   a fourth node connects a negative terminal of the second high voltage battery, another input of the second protection device, and an input of a fourth relay;
   a fifth node connects an output of the first relay, one output of the first protection device, another input of the third protection device, an output of the second protection device, the fourth node, and a first auxiliary output; and
   a sixth node connects another output of the first protection device, an output of the third relay, another output of the second protection device, an output of the fourth relay, and a second auxiliary output.

6. The switchable BDU system of claim 5, wherein the controller is configured to control the switchable BDU to transition from standby to a drive mode by commanding the following sequence:
   close the fourth relay;
   close the second relay;
   close the contactor of the second protection device;
   open the second and fourth relays; and
   close the contactor of the first protection device,
   wherein both the first and second high voltage batteries are connected to the electrified powertrain via the first and second auxiliary outputs.

7. The switchable BDU system of claim 5, wherein the controller is configured to control the switchable BDU to transition from standby to a 400V charging mode by commanding the following sequence:
   close the fourth relay;
   close the second relay;
   close the contactor of the second protection device;
   open the second and fourth relays;
   close the contactor of the first protection device; and
   close the contactor of the third protection device, wherein both the first and second high voltage batteries are thereby connected, through the third protection device in parallel, to a DC fast charging station via the first and second charging outputs, and wherein both the first and second high voltage batteries are also connected to an auxiliary circuit via the first and second auxiliary outputs.

8. The switchable BDU system of claim 5, wherein the controller is configured to control the switchable BDU to transition from standby to an 800V charging mode by commanding the following sequence:
close the third relay;
close the first relay;
open the contactor of the first protection device;
open the third and first relays;
close the fifth relay; and
close the contactor of the third protection device,
wherein both the first and second high voltage batteries are connected, through the third protection device in series, to a DC fast charging station via the first and second charging outputs.

9. The switchable BDU system of claim 8, wherein the controller is further configured to control the switchable BDU to shift the auxiliary load from the first high voltage battery to the second high voltage battery by commanding the following sequence:
open the contactor of the first protection device;
close the fourth relay;
close the second relay;
close the contactor of the second protection device; and
open the second and fourth relays.

10. The switchable BDU system of claim 1, wherein at least one of the one or more protection devices further includes an integrated temperature sensor.

11. A control method for a switchable battery disconnect unit (BDU) system for an electrified vehicle, the control method comprising:
providing a switchable BDU for a high voltage battery system of the electrified vehicle, the switchable BDU including one or more protection devices that each include both a contactor and an integrated circuit breaker;
controlling, by a controller, the switchable BDU to switch between 400 Volts (400V) and 800 V direct current (DC) modes for powering an electrified powertrain of the electrified vehicle and for recharging the high voltage battery system; and
monitoring and resetting, by the controller, the protection device in response to an actuation of the integrated circuit breaker,
wherein each protection device does not include a replaceable thermal fuse.

12. The control method of claim 11, wherein the protection device is configured to actuate or open the integrated circuit breaker in response to a current spike.

13. The control method of claim 12, wherein the actuation or opening of the integrated circuit breaker prevents the current spike from welding the contactor closed.

14. The control method of claim 11, wherein the high voltage battery system is separable into first and second high voltage batteries, and wherein the switchable BDU includes three protection devices and five relays.

15. The control method of claim 14, wherein:
a first node connects a positive terminal of the first high voltage battery, an input of a first relay, one input of a first protection device, and one input of a third protection device, wherein outputs of the third protection device connect to first and second charging outputs;
a second node connects a negative terminal of the first high voltage battery, another input of the first protection device, an input of a third relay, and an input of a fifth relay;
a third node connects a positive terminal of the second high voltage battery, an output of the fifth relay, an input of a second relay, and one input of a second protection device;
a fourth node connects a negative terminal of the second high voltage battery, another input of the second protection device, and an input of a fourth relay;
a fifth node connects an output of the first relay, one output of the first protection device, another input of the third protection device, an output of the second protection device, the fourth node, and a first auxiliary output; and
a sixth node connects another output of the first protection device, an output of the third relay, another output of the second protection device, an output of the fourth relay, and a second auxiliary output.

16. The control method of claim 15, further comprising controlling, by the controller, the switchable BDU to transition from standby to a drive mode by commanding the following sequence:
close the fourth relay;
close the second relay;
close the contactor of the second protection device;
open the second and fourth relays; and
close the contactor of the first protection device,
wherein both the first and second high voltage batteries are connected to the electrified powertrain via the first and second auxiliary outputs.

17. The control method of claim 15, further comprising controlling, by the controller, the switchable BDU to transition from standby to a 400 V charging mode by commanding the following sequence:
close the fourth relay;
close the second relay;
close the contactor of the second protection device;
open the second and fourth relays;
close the contactor of the first protection device; and
close the contactor of the third protection device,
wherein both the first and second high voltage batteries are thereby connected, through the third protection device in parallel, to a DC fast charging station via the first and second charging outputs, and wherein both the first and second high voltage batteries are also connected to an auxiliary circuit via the first and second auxiliary outputs.

18. The control method of claim 15, further comprising controlling, by the controller, the switchable BDU to transition from standby to an 800 V charging mode by commanding the following sequence:
close the third relay;
close the first relay;
open the contactor of the first protection device;
open the third and first relays;
close the fifth relay; and
close the contactor of the third protection device,
wherein both the first and second high voltage batteries are connected, through the third protection device in series, to a DC fast charging station via the first and second charging outputs.

19. The control method of claim 18, further comprising controlling, by the controller, the switchable BDU to shift the auxiliary load from the first high voltage battery to the second high voltage battery by commanding the following sequence:
   open the contactor of the first protection device;
   close the fourth relay;
   close the second relay;
   close the contactor of the second protection device; and
   open the second and fourth relays.

20. The control method of claim 11, wherein at least one of the one or more protection devices further includes an integrated temperature sensor.

\* \* \* \* \*